United States Patent
Jones et al.

(10) Patent No.: US 11,075,271 B2
(45) Date of Patent: Jul. 27, 2021

(54) STEPPED FIELD PLATES WITH PROXIMITY TO CONDUCTION CHANNEL AND RELATED FABRICATION METHODS

(71) Applicant: Cree, Inc., Durham, NC (US)

(72) Inventors: Evan Jones, Durham, NC (US); Terry Alcorn, Cary, NC (US); Jia Guo, Apex, NC (US); Fabian Radulescu, Chapel Hill, NC (US); Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/600,825

(22) Filed: Oct. 14, 2019

(65) Prior Publication Data

US 2021/0111254 A1   Apr. 15, 2021

(51) Int. Cl.
*H01L 29/40* (2006.01)
*H01L 29/66* (2006.01)
*H01L 29/778* (2006.01)

(52) U.S. Cl.
CPC ...... *H01L 29/407* (2013.01); *H01L 29/66462* (2013.01); *H01L 29/7786* (2013.01)

(58) Field of Classification Search
CPC .............. H01L 29/407; H01L 29/7786; H01L 29/66462
See application file for complete search history.

(56) References Cited

U.S. PATENT DOCUMENTS

| 5,192,987 | A | 3/1993 | Khan et al. |
|---|---|---|---|
| 5,290,393 | A | 3/1994 | Nakamura |
| 5,296,395 | A | 3/1994 | Khan et al. |
| 5,393,993 | A | 2/1995 | Edmond et al. |
| 5,523,589 | A | 6/1996 | Edmond et al. |
| 5,686,738 | A | 11/1997 | Moustakas |
| 5,739,554 | A | 4/1998 | Edmond et al. |
| 6,100,571 | A * | 8/2000 | Mizuta ............ H01L 27/095 257/488 |
| 6,316,793 | B1 | 11/2001 | Sheppard et al. |
| 6,548,333 | B2 | 4/2003 | Smith |
| 6,586,781 | B2 | 7/2003 | Wu et al. |

(Continued)

FOREIGN PATENT DOCUMENTS

CN   110071173 A   7/2019

OTHER PUBLICATIONS

Notification of Transmittal of the International Search Report and the Written Opinion of the International Searching Authority, or the Declaration, in corresponding PCT Application No. PCT/US2020/054510 (dated Apr. 30, 2021).

*Primary Examiner* — Sitaramarao S Yechuri
(74) *Attorney, Agent, or Firm* — Myers Bigel, P.A.

(57) ABSTRACT

A transistor includes a semiconductor layer structure, a source electrode and a drain electrode on the semiconductor layer structure, a gate on a surface of the semiconductor layer structure between the source electrode and the drain electrode, and a field plate. The field plate includes a first portion adjacent the gate and a second portion adjacent the source or drain electrode. The second portion of the field plate is farther from the surface of the semiconductor layer structure than the first portion of the field plate, and is closer to the surface of the semiconductor layer structure than an extended portion of the gate. Related devices and fabrication methods are also discussed.

29 Claims, 7 Drawing Sheets

(56) References Cited

U.S. PATENT DOCUMENTS

| | | |
|---|---|---|
| 7,045,404 B2 | 5/2006 | Sheppard et al. |
| 8,283,699 B2 | 10/2012 | Wu |
| 9,741,840 B1 | 8/2017 | Moens et al. |
| 9,847,411 B2 | 12/2017 | Sriram et al. |
| 2002/0167023 A1 | 11/2002 | Chavarkar et al. |
| 2003/0020092 A1 | 1/2003 | Parikh et al. |
| 2006/0043416 A1* | 3/2006 | P. Li ................. H01L 29/66462 257/192 |
| 2008/0128752 A1 | 6/2008 | Wu |
| 2009/0108299 A1* | 4/2009 | Smorchkova ..... H01L 29/66462 257/194 |
| 2013/0127521 A1 | 5/2013 | Simin et al. |
| 2014/0361342 A1 | 12/2014 | Sriram et al. |
| 2019/0140086 A1* | 5/2019 | Chikamatsu .......... H01L 29/778 |

* cited by examiner

STEPPED FIELD PLATES WITH PROXIMITY TO CONDUCTION CHANNEL AND RELATED FABRICATION METHODS

FIELD

The present invention relates to semiconductor devices, and more particularly, to transistors including field plates and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 2.996 eV for alpha SiC at room temperature) and the Group III nitrides (e.g., with a bandgap of about 3.36 eV for gallium nitride (GaN) at room temperature). These materials, typically, may have higher electric field breakdown strengths and higher electron saturation velocities as compared to GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide performance advantages over metal-semiconductor field effect transistors (MESFETS) for high-frequency applications.

HEMTs fabricated in the gallium nitride/aluminum gallium nitride (GaN/AlGaN) material system can generate large amounts of radio frequency (RF) power due to a combination of material characteristics, such as relatively high breakdown fields, relatively wide bandgaps, relatively large conduction band offset, and/or relatively high saturated electron drift velocity. Different types of HEMTs in the GaN/AlGaN system have been demonstrated. For example, U.S. Pat. Nos. 5,192,987 and 5,296,395 describe AlGaN/GaN HEMT structures and methods of manufacture. In addition, U.S. Pat. No. 6,316,793, to Sheppard et al. describes a HEMT device having a semi-insulating silicon carbide substrate, an AlN buffer layer on the substrate, an insulating GaN layer on the buffer layer, an AlGaN barrier layer on the GaN layer, and a passivation layer on the AlGaN active structure. Moreover, U.S. Pat. No. 7,045,404 to Sheppard et al. describes a HEMT device including a protective layer and/or a low damage recess fabrication technique which may reduce damage to the semiconductor in the gate region of the transistor that can occur during an anneal of the ohmic contacts of the device.

Electron trapping and resulting differences between DC and RF characteristics can be a limiting factor in the performance of these devices. Silicon nitride (SiN) passivation has been employed to alleviate this trapping problem resulting in high performance devices with power densities over 10 W/mm at 10 GHz. For example, U.S. Pat. No. 6,586,781 to Wu et al. describes methods and structures for reducing trapping effect in GaN-based transistors. However, due to the high electric fields existing in these structures, charge trapping can still be a concern.

Field plates have been used to enhance the performance of GaN-based HEMTs at microwave frequencies and have exhibited performance improvement over non-field-plated devices. Some field plate approaches may involve connecting the field plate to the gate of the transistor, with the field plate on top of the drain side of a channel. This configuration can result in a reduction of the electric field on the gate-to-drain side of the transistor, thereby increasing breakdown voltage and reducing the high-field trapping effect. However, transistors with gate-to-drain field plates can exhibit relatively poor reliability performance, particularly at class C (or higher class) operation where the electric field on the source side of the gate becomes significant.

SUMMARY

According to some embodiments, a transistor includes a semiconductor layer structure, a source electrode and a drain electrode on the semiconductor layer structure, a gate on a surface of the semiconductor layer structure between the source electrode and the drain electrode, and a field plate. The field plate includes a first portion adjacent the gate and a second portion adjacent the source or drain electrode. The second portion of the field plate is farther from the surface of the semiconductor layer structure than the first portion of the field plate, and is closer to the surface of the semiconductor layer structure than an extended portion of the gate, which is adjacent the surface of the semiconductor layer structure.

In some embodiments, the second portion of the field plate may be adjacent the drain electrode.

In some embodiments, the transistor may further include a spacer insulator layer including a plurality of spacer layers that are stacked on the surface of the semiconductor layer to define first, second, and third thicknesses that separate the first portion of the field plate, the second portion of the field plate, and the extended portion of the gate from the surface of the semiconductor layer structure, respectively.

In some embodiments, the third thickness defined by the plurality of spacer layers may be substantially uniform at opposing sides of the gate. In some embodiments, the plurality of spacer layers may define substantially coplanar surfaces at opposing sides of the gate, and the extended portion of the gate may laterally extend along one of the substantially coplanar surfaces toward the first portion of the field plate.

In some embodiments, the plurality of spacer layers may include a first spacer layer having a recess in a surface thereof, a second spacer layer including a first portion in the recess and a second portion on the surface of the first spacer layer outside the recess, and a third spacer layer having substantially coplanar surfaces on the second spacer layer with the field plate therebetween. The first and second portions of the second spacer layer may be between the first and second portions of the field plate and the surface of the semiconductor layer structure, respectively.

In some embodiments, respective upper surfaces of the first portion of the field plate and the second portion of the second spacer layer may be substantially coplanar.

In some embodiments, the first and second portions of the field plate may be confined below the substantially coplanar surfaces of the third spacer layer.

In some embodiments, the extended portion of the gate may include sidelobe portions that laterally extend directly along the substantially coplanar surfaces at the opposing sides of the gate. In some embodiments, the opposing sidelobe portions of the gate may be substantially symmetrical.

In some embodiments, sidewall spacers may separate the gate from one or more of the plurality of spacer layers at the opposing sides thereof. The first portion of the field plate may laterally extend toward the gate and may be separated therefrom by one of the sidewall spacers.

In some embodiments, the field plate may be a first field plate, and a second field plate may be provided on a surface of the spacer insulator layer and extending through a portion thereof to contact the first field plate. In some embodiments, the second field plate may laterally extend toward the drain electrode beyond the second portion of the first field plate.

In some embodiments, the first portion of the field plate and the extended portion of the gate may laterally extend towards one another and may be non-overlapping in a direction perpendicular to the surface of the semiconductor layer structure.

In some embodiments, the semiconductor layer structure may include a buffer layer and a barrier layer that are stacked and configured to define a two dimensional electron gas (2DEG) channel layer at a heterojunction therebetween.

According to some embodiments, a transistor includes a semiconductor layer structure, a source electrode and a drain electrode on the semiconductor layer structure, a gate on a surface of the semiconductor layer structure between the source electrode and the drain electrode, and a field plate between the gate and the source or drain electrode. The field plate is closer to the surface of the semiconductor layer structure than a laterally extended portion of the gate, and the laterally extended portion of the gate is free of overlap with the field plate.

In some embodiments, the field plate may include a first portion adjacent the gate and a second portion adjacent the source or drain electrode. The second portion may be farther from the surface of the semiconductor layer structure than the first portion.

In some embodiments, a spacer insulator layer may include a plurality of spacer layers that are stacked on the surface of the semiconductor layer to define first, second, and third thicknesses that separate the first portion of the field plate, the second portion of the field plate, and the laterally extended portion of the gate from the surface of the semiconductor layer structure, respectively.

In some embodiments, the plurality of spacer layers may define substantially coplanar surfaces at opposing sides of the gate, and the laterally extended portion of the gate may include sidelobe portions that laterally extend directly along the substantially coplanar surfaces at the opposing sides of the gate.

In some embodiments, the plurality of spacer layers may include a first spacer layer having a recess in a surface thereof, a second spacer layer including a first portion in the recess and a second portion on the surface of the first spacer layer outside the recess, and a third spacer layer having the substantially coplanar surfaces on the second spacer layer with the field plate therebetween. The first and second portions of the second spacer layer may be between the first and second portions of the field plate and the surface of the semiconductor layer structure, respectively.

In some embodiments, the field plate may be a first field plate, and a second field plate may be provided on a surface of the spacer insulator layer and extending through a portion thereof to contact the first field plate. In some embodiments, the second field plate may laterally extend toward the drain electrode beyond the second portion of the first field plate.

According to some embodiments, a transistor includes a channel layer and a barrier layer defining a heterojunction therebetween, a source electrode and a drain electrode on the barrier layer, a gate on the barrier layer and including sidelobe portions laterally extending from opposing sides of the gate toward the source electrode and the drain electrode, respectively, a field plate on the barrier layer between the gate and the drain electrode, and a spacer insulator layer including a plurality of spacer layers with the field plate therebetween. The spacer layers are stacked on the barrier layer at the opposing sides of the gate and separate the sidelobe portions of the gate from the barrier layer.

In some embodiments, the plurality of spacer layers may define substantially coplanar surfaces at the opposing sides of the gate with the sidelobe portions of the gate laterally extending directly thereon.

In some embodiments, the spacer layers may have a substantially uniform thickness at the opposing sides of the gate.

In some embodiments, the field plate may include a first portion adjacent the gate and a second portion adjacent the drain electrode, and the second portion may be farther from a surface of the barrier layer than the first portion. In some embodiments, the second portion of the field plate may be closer to the surface of the barrier layer than the sidelobe portions of the gate.

In some embodiments, the plurality of spacer layers may be stacked to define first, second, and third thicknesses that separate the first portion of the field plate, the second portion of the field plate, and the sidelobe portions of the gate from the surface of the barrier layer, respectively.

In some embodiments, the first portion of the field plate and one of the sidelobe portions of the gate may laterally extend towards one another and may be non-overlapping in a direction perpendicular to the surface of the barrier layer.

In some embodiments, sidewall spacers may separate the gate from the plurality of spacer layers at the opposing sides thereof. The first portion of the field plate may laterally extend toward the gate and may be separated therefrom by one of the sidewall spacers.

According to some embodiments, a method of fabricating a transistor includes forming a channel layer and a barrier layer defining a heterojunction therebetween, forming a source electrode, a drain electrode, and a gate on the barrier layer, where the gate includes sidelobe portions laterally extending from opposing sides of the gate toward the source electrode and the drain electrode, respectively, and forming a spacer insulator layer and a field plate on the barrier layer. The spacer insulator layer includes a plurality of spacer layers with the field plate therebetween. The spacer layers are stacked on the barrier layer at the opposing sides of the gate and separate the sidelobe portions of the gate from the barrier layer.

In some embodiments, the plurality of spacer layers may be formed to define substantially coplanar surfaces at the opposing sides of the gate with the sidelobe portions of the gate laterally extending directly thereon.

In some embodiments, the field plate may be formed to include a first portion adjacent the gate and a second portion adjacent the drain electrode, and the second portion may be farther from a surface of the barrier layer than the first portion.

In some embodiments, forming the spacer insulator layer and the field plate may include forming a first spacer layer comprising a recess in a surface thereof, forming a second spacer layer comprising a first portion in the recess and a second portion on the surface of the first spacer layer outside the recess, forming the first and second portions of the field plate on the first and second portions of the second spacer layer, respectively, and forming a third spacer layer on the second spacer layer and the first and second portions of the field plate.

In some embodiments, the field plate may be a first field plate. The method may further include forming an opening extending through the third spacer layer to expose at least one of the first or second portions of the first field plate, and forming a second field plate on the third spacer layer and extending into the opening to contact the first field plate.

Other devices and methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Field plates are conductive structures that can be configured to alter the electric field distribution in a channel region of transistor devices to improve operating characteristics (e.g., breakdown voltage, gain, maximum operating frequency) of the devices. For example, in HEMTs or other semiconductor-based field-effect transistor (FET) devices, large electric fields may arise during normal operation in the gate-drain region. Field plates may be configured to reduce the peak electric field in the device active region for a given bias voltage. Such field plates may not only manage field distribution, but may also affect both the drain-to-source and gate-to-drain capacitances $C_{ds}$, $C_{gd}$. Field plates positioned between the gate and drain (also referred to as the gate-drain region) may also be configured to modulate the device active region, resulting in a decrease of surface trapping effects that can affect proper device operation under large radio frequency (RF) signals. More generally, field plates may function to alleviate detrimental effects (low breakdown voltage, charge trapping phenomena, poor reliability) that may arise when a device is operated at a high electric field.

Embodiments of the present invention provide particular configurations and fabrication methods for field plate structures that can reduce capacitance, trapping effects, and/or peak electric field distribution. In particular, embodiments of the present invention allow for fabrication of stepped or graded field plate structures, whereby the spacing or separation between the conduction channel and the field plate is reduced. In some embodiments, the field plate may be provided between the gate and the drain, to thereby reduce gate-to-drain capacitance $C_{gd}$ and peak electric field in proximity to the drain supply voltage.

For example, a buried field plate may include a first portion adjacent the gate that is separated from a surface of a semiconductor layer structure (in which a conduction channel is induced or otherwise defined) by a first distance or spacing, and a second portion adjacent the drain electrode that is separated from the surface of the semiconductor layer by a second distance or spacing that is greater than the first distance or spacing. A recess in in a spacer layer adjacent the gate may be used to define the first and second portions of the buried field plate in a stepped geometry (with the first and second step portions at the different distances or spacings from the semiconductor layer surface) and/or a graded geometry (with a graded portion extending from one of or connecting the step portions). In some embodiments, an additional sidewall spacer may be included to control a lateral spacing between the gate and the field plate. As used herein, the term "lateral" refers to a direction that is substantially parallel with respect to a major surface of the semiconductor layer structure. Also, some embodiments may include a second or additional field plate that extends through one or more spacer layers to contact the buried field plate, thereby defining a second "step" in the stepped or graded field plate structure. Providing the buried field plate in closer proximity to the gate and/or the conduction channel may enhance or improve reduction in $C_{gd}$ and trapping effects. The stepped or graded field plate structure may also reduce the peak electric field in proximity to the drain supply voltage.

Figure 1:
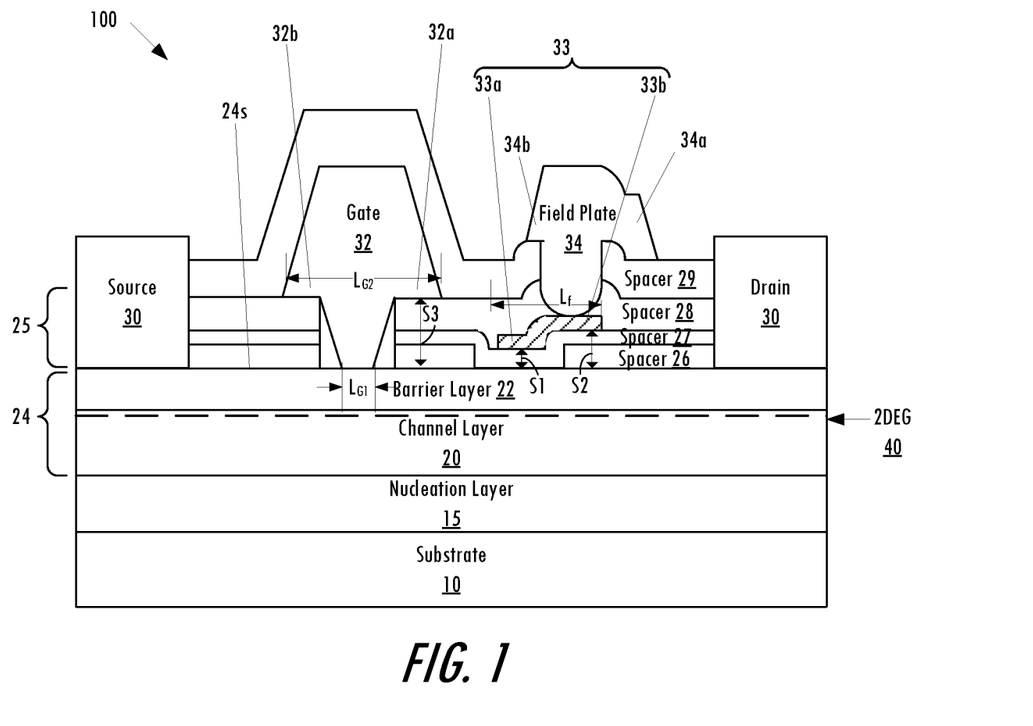
FIG. 1 is a schematic cross-section of a unit cell of a transistor device including a buried field plate according to some embodiments of the present invention.

FIG. 1 is a schematic cross-section of a unit cell of a transistor structure including a buried field plate according to some embodiments of the present invention. In particular, FIG. 1 illustrates an example of a HEMT including a buried field plate having a stepped or graded structure as described herein.

A HEMT includes a channel layer and a barrier layer on the channel layer. Source and drain electrodes may be formed as ohmic contacts with the barrier layer. A gate is formed on a surface of the barrier layer between the source and drain electrodes, and a spacer insulator layer is formed above the barrier layer. Depending on configuration, the spacer insulator layer may be formed before or after formation of the gate. The spacer insulator layer may be a dielectric layer, a layer of undoped or depleted $Al_xGa_{1-x}N$ (0≤x≤1) material, or a combination thereof. A conductive field plate is formed in the spacer insulator layer and extends a distance Lf from the gate towards the source or drain electrode. The field plate may be electrically connected to the source electrode. The electrical connection between the field plate and the source electrode may be outside the active region of the device in some cases. The field plate may reduce the peak electric field in the device resulting in increased breakdown voltage and reduced charge trapping. The reduction of the electric field may also yield other benefits such as reduced leakage currents and enhanced reliability.

The HEMT may include a Group-III nitride based semiconductor layer structure, although other material systems can also be used. It should be noted that while described herein primarily with reference to fabrication of a HEMT, the elements and concepts of embodiments described herein can be applied to many different types of transistor structures, including but not limited to Metal Semiconductor Field Effect Transistors (MESFETs) and Metal Oxide Semiconductor Heterostructure Field Effect Transistors (MOSHFETs).

Referring now to FIG. 1, a HEMT 100 includes GaN-based or other Group III nitride-based semiconductor layer structure 24 on a substrate 10. Group III nitrides may refer to semiconductor compounds formed between nitrogen and the elements in the Group III of the periodic table, such as aluminum (Al), gallium (Ga), and/or indium (In) to form binary (e.g., GaN), ternary (e.g., AlGaN, AlInN), and quaternary (e.g., AlInGaN) compounds. Accordingly, formulas such as $Al_xGa_{1-x}N$, where $0 \leq x \leq 1$, may be used to describe these compounds. The substrate 10 may include silicon carbide, silicon, sapphire, spinel, zinc oxide, silicon, gallium arsenide, zinc oxide, or any other material capable of supporting growth of Group III-nitride materials. Silicon carbide may have a closer crystal lattice match to Group III than sapphire, and may allow for formation of higher-quality Group III nitride films thereon. Silicon carbide also has a very high thermal conductivity, such that the total output power of Group III nitride devices on silicon carbide may not be limited by the thermal dissipation of the substrate (as may be the case with some devices formed on sapphire).

Optional buffer, nucleation and/or transition layers may also be formed on the substrate 10. For example, a nucleation layer 15 can be formed on the substrate 10 to reduce the lattice mismatch between the substrate 10 and the next layer of the semiconductor layer structure 24. The formation and composition of the nucleation layer 15 can depend on the material used for the substrate 10. For example, An $Al_zGa_{1-z}N$ ($0 \leq z \leq 1$) nucleation layer 15 can be grown on the substrate 10 via epitaxial growth methods, such as MOCVD (Metalorganic Chemical Vapor Deposition), HVPE (Hydride Vapor Phase Epitaxy) or MBE (Molecular Beam Epitaxy). Methods of forming a nucleation layer 15 on various substrates are described in U.S. Pat. No. 5,290,393 to Nakamura and U.S. Pat. No. 5,686,738 to Moustakas. Methods of forming nucleation layers on silicon carbide substrates are described in U.S. Pat. No. 5,393,993 to Edmond et al., U.S. Pat. No. 5,523,589 to Edmond et al., and U.S. Pat. No. 5,739,554 to Edmond et al.

The semiconductor layer structure 24 of the HEMT 100 includes a channel layer 20 and a barrier layer 22. The channel layer 20 may be formed on the nucleation layer 15. A barrier layer 22 may be formed on the channel layer 20 opposite the nucleation layer 15 and the substrate 10. One or both of the channel layer 20 and the barrier layer 22 may include sub-layers including doped or undoped (i.e., "unintentionally doped") layers of Group III-nitride materials, including material compositions which may be stepwise or continuously graded. In some embodiments, the channel layer 20 may include one or more layers of $Al_xGa_yIn_{(1-x-y)}N$ where $0 \leq x \leq 1$, $0 \leq y \leq 1$, and $x+y \leq 1$. For example, the channel layer 20 may be a GaN layer. In some embodiments, the barrier layer 22 may include one or more layers of $Al_xGa_{1-x}N$ or $Al_xIn_yGa_{1-x-y}N$, where $0 \leq x \leq 1$, $0 \leq y \leq 1$, and $x+y \leq 1$. The semiconductor layer structure 24 may be an epitaxial structure including these and/or other layers formed on the substrate 10 via epitaxial growth methods. For example, the channel and barrier layers 20, 22 can be formed using the same or similar methods used to grow the nucleation layer 15. Electrical isolation between devices can be accomplished through mesa etch or ion implementation outside the active region of the HEMT 100.

In the HEMT device 100, the channel layer 20 and the barrier layer 22 may be formed of materials having different bandgaps, such that a heterojunction is defined at an interface between the channel layer 20 and the barrier layer 22. In particular, where both the channel layer 20 and the barrier layer 22 are formed of Group III-nitride layers, the channel layer 20 may be a GaN layer, and the barrier layer 22 may be an AlGaN layer. A 2DEG conduction channel 40 can be induced at the heterointerface between the channel layer 20 and the barrier layer 22, and the channel layer 20, 2DEG conduction channel 40 and barrier layer 22 can generally form the active region of the HEMT 100.

In other embodiments, the channel layer 20 and the barrier layer 22 may have different lattice constants. For example, the barrier layer 22 may be a relatively thin layer having a smaller lattice constant than the channel layer 20, such that the barrier layer 22 "stretches" at the interface between the two. Accordingly, a pseudomorphic HEMT (pHEMT) device may be provided. Example HEMT structures are illustrated in U.S. Pat. No. 6,316,793 to Sheppard et al., U.S. Pat. No. 6,586,781 to Wu et al., U.S. Pat. No. 6,548,333 to Smith and U.S. Patent Application Publication Nos. 2002/0167023 to Prashant et al., and 2003/0020092 to Parikh et al. Other nitride based HEMT structures are illustrated in U.S. Pat. No. 5,192,987 to Kahn et al. and U.S. Pat. No. 5,296,395 to Kahn et al.

Source and drain electrodes 30 are formed on the semiconductor layer structure 24 to define ohmic contacts with the barrier layer 22. A gate 32 is formed on a surface of the barrier layer 22 between the source and drain electrodes 30. Electrical current can flow between the source and drain electrodes 30 through the 2DEG conduction channel 40 at the heterointerface defined by the channel layer 20 and the barrier layer 22 when the gate 32 is biased at the appropriate level.

Formation of the gate 32 may include depositing a dielectric or other spacer insulator layer 25, etching through the spacer insulator layer 25 using a mask and/or other sacrificial layer, and depositing a gate into the etched portion of the spacer insulator layer 25. Formation of source and drain electrodes 30 may be likewise performed, as described by way of example in the patents and publications referenced above. In some embodiments, the gate 32 may include one or more extended portions that laterally extend onto portions of the spacer insulator layer 25, for example, opposing sidelobe portions 32a, 32b that define a T-shape (also referred to herein as a "T-gate"). The gate 32 and sidelobe portions 32a, 32b can define multiple different lengths ($L_{G1}$ and $L_{G2}$). The sidelobe portions 32a, 32b may extend substantially symmetrically onto the spacer insulator layer 25 at opposing sides of the gate 32 in some embodiments.

As shown in FIG. 1, the spacer insulator layer 25 includes multiple spacer layers 26, 27, 28 that are sequentially stacked on the surface 24s of the semiconductor layer structure 24. The spacer insulator layer 25 also includes a buried field plate 33 between the spacer layers 26, 27, 28 at one side of the gate 32. The buried field plate 33 includes metal or other conductive materials, for example, copper, gold, and/or a composite metal. In some embodiments, the buried field plate 33 may be positioned between the gate 32 and a drain electrode 30 so as to reduce the peak or otherwise redistribute the electric field, to reduce gate-to-drain capacitance $C_{gd}$, and/or to reduce trapping effects on the drain side of the HEMT 100. A buried field plate having a similar stepped structure (not shown) may additionally or alternatively be positioned between the gate 32 and the source electrode 30 in some embodiments.

The buried field plate 33 has a stair-step profile including two or more portions, illustrated by way of example herein with reference to a first step portion 33a adjacent the gate 32 and a second step portion 33b adjacent the drain electrode 30. The step portions 33a, 33b of the field plate 33 may be defined by a continuous layer, or by a stack of discontinuous layers. That is, the step portions 33a, 33b of the field plate 33 may be defined by a single layer or by multiple layers. In some embodiments, the step portions 33a, 33b may include a discontinuity therebetween. Each step portion 33a, 33b of the field plate 33 is positioned at a different distance or spacing from the surface 24s (and thus, the underlying conduction channel 40). The field plate 33 including first and second step portions 33a and 33b at closer and farther distances or spacings from the conduction channel 40 may allow for reduction of $C_{gd}$ and trapping effects, as well as reduction in peak electric field proximate the drain electrode 30.

In particular, as shown in FIG. 1, the spacer layers 26, 27 may be sequentially stacked to define different thicknesses between the first and second portions 33a, 33b of the buried field plate 33 and the surface 24s to provide the different spacings S1, S2. For example, the spacer layer 26 may include a recess therein such that when the spacer layer 27 and the buried field plate 33 are sequentially formed on the spacer layer 26 and in the recess, the portion 33a of the field plate 33 is closer to the surface 24s than the portion 33b.

In addition, the spacer layers 26, 27, 28 may separate the sidelobe portions 32a, 32b from the surface 24s at opposing sides of the gate 32. For example, the spacer layers 26, 27, 28 may define a substantially uniform thickness or spacing S3 and/or coplanar surfaces at opposite sides of the gate 32, onto which the sidelobe portions 32a, 32b of the gate 32 extend. In some embodiments, the sidelobe portion 32a of the gate 32 and the step portion 33a of the field plate 33 may be overlapping and separated by portions of the third spacer layer 28. In some embodiments, the sidelobe portion 32a of the gate 32 and the step portion 33a of the field plate 33 may be non-overlapping in a direction perpendicular to the surface 24s.

The spacer layers 26, 27, 28 may be formed to position the second step portion 33b of the buried field plate 33 farther from the surface 24s of the semiconductor layer structure 24 (and thus, the conduction channel 40) than the first step portion 33a, and closer to the surface 24s of the semiconductor layer structure 24 than the sidelobe portions 32a, 32b of the gate 32. More generally, the spacer insulator layer 25 may be a multi-layer stack with layers 26, 27, 28 having respective thicknesses that can be formed to control the distance or spacing between the gate sidelobe portions 32a, 32b and the surface 24s, the distance or spacing between the field plate step portions 33a, 33b and the surface 24s, and/or the distance or spacing between the gate sidelobe portions 32a, 32b and the field plate step portions 33a, 33b.

The HEMT 100 may also include an additional or second field plate 34 that extends through an upper spacer layer 29 to contact the first and/or second step portions 33a, 33b of the buried field plate 33. The second field plate 34 may also have a stepped or graded structure, with a first portion 34a that is closer to the surface 24s of the semiconductor layer structure 24 than a second portion 34b. The first portion 34a of the second field plate 34 may also be closer to the drain electrode 30, and may allow for further control of $C_{gd}$, trapping effects, and/or peak electric field proximate the drain electrode 30.

Although illustrated in FIG. 1 in a planar HEMT configuration with the gate 32 and the source and drain electrodes 30 on the surface 24s of the barrier layer 22, it will be understood that buried field plates 33 with stepped or graded field structures in accordance with embodiments of the present invention may be used in other HEMT configurations, such as recessed gate HEMTs (where the source and drain electrodes 30 are elevated relative to the gate 32 on the surface 24s) and recessed source/drain HEMTs (where the source and drain electrodes 30 extend toward the channel layer 20 beyond the surface 24s).

FIGS. 2-12 are schematic cross-sectional views illustrating exemplary intermediate fabrication steps in methods for fabricating transistor devices according to some embodiments of the present invention. The examples of FIGS. 2-12 illustrate fabrication of a buried field plate having a stepped or graded structure between the gate and drain electrode of the transistor device; however, it will be understood that similar fabrication steps may be additionally or alternatively used to fabricate a field plate (not shown) between the gate and the source electrode in some embodiments.

Figure 2:
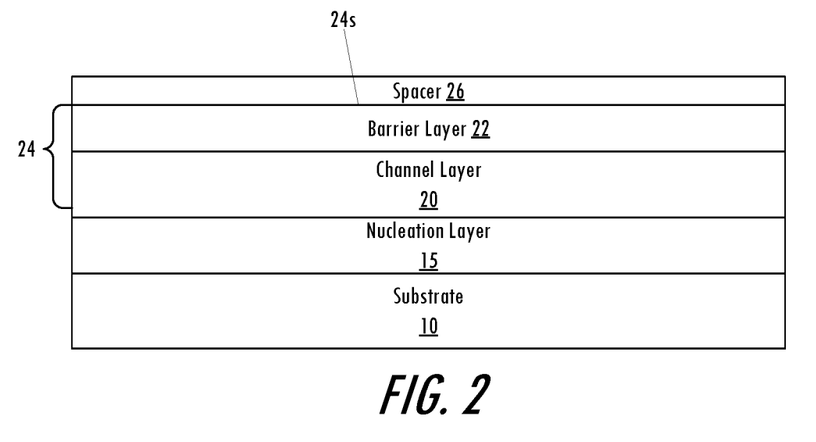
FIGS. 2-12 are schematic cross-sectional views illustrating exemplary intermediate fabrication steps in methods for fabricating transistor devices according to some embodiments of the present invention.

As shown in FIG. 2, a first spacer layer 26 is formed on a surface 24s of a semiconductor layer structure 24 including a barrier layer 22 that defines a heterojunction with an underlying channel layer 20. As discussed above, the channel layer 20 and the barrier layer 22 may be an epitaxial structure (e.g., including Group III nitride materials) formed via epitaxial growth methods. A nucleation layer 15 can be formed on the substrate 10 (e.g., a SiC substrate) to reduce lattice mismatch with the substrate 10. The first spacer layer 26 may be a dielectric or other insulator layer that is blanket formed on the barrier layer 22. For example, the first spacer layer 26 may be a silicon nitride or silicon oxide layer formed by high quality sputtering and/or vapor deposition methods.

Figure 3:
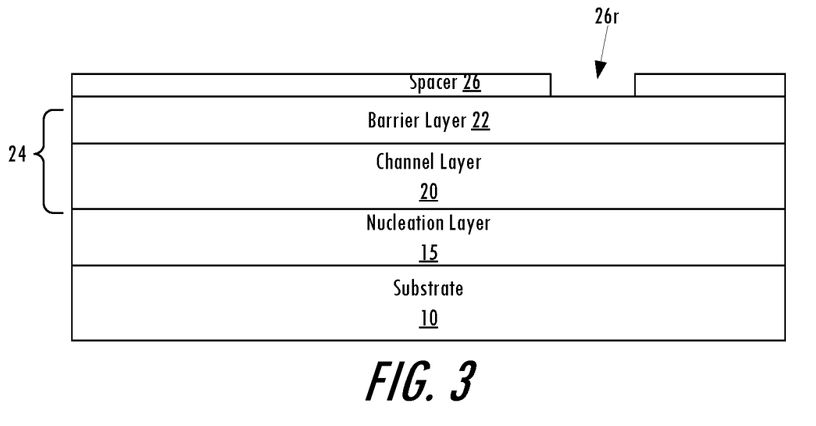

In FIG. 3, an aperture or recess 26r is defined in the first spacer layer 26. For example, the recess 26r may be optically defined and opened using a mask that exposes a portion of the spacer layer 26. The lateral position and/or width of the recess 26r may be selected to provide the step portions 33a, 33b of the buried field plate 33 at desired distances from the gate and drain electrode to be formed in a subsequent step. The recess 26r may extend through the spacer layer 26 to expose the surface 24s of the semiconductor layer structure 24 in some embodiments.

Figure 4:
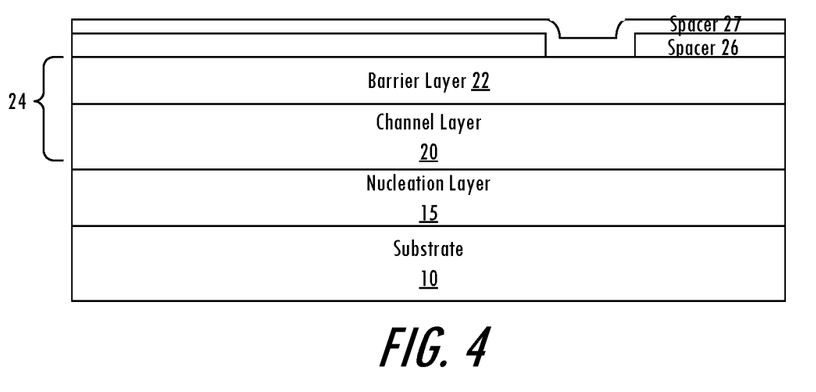

In FIG. 4, a second spacer layer 27 is formed on the first spacer layer 26. The second spacer layer 27 may conformally extend along the surface of the first spacer layer 26 and into the recess 26r along a bottom surface and sidewalls of the recess 26r to define a step difference between portions thereof within and outside the recess 26r. The second spacer layer 27 may likewise be a dielectric or other insulator layer (e.g., a silicon nitride or silicon oxide layer), and may be formed by similar or different methods than the first spacer layer 26.

Figure 5:
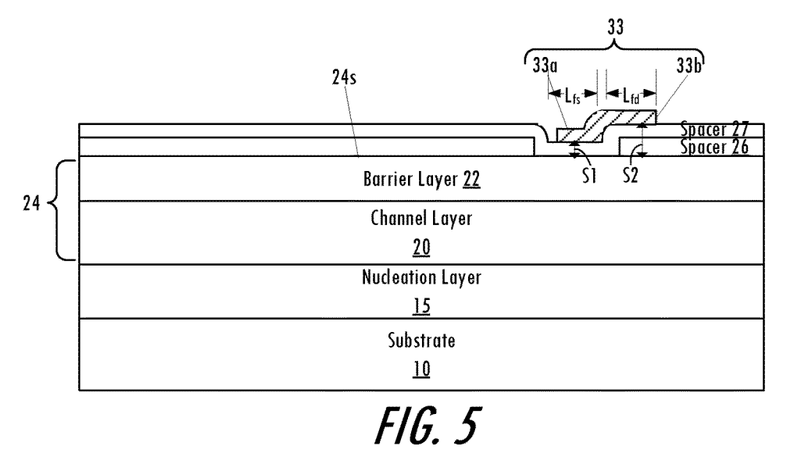

FIG. 5 illustrates formation of a field plate 33 on the second spacer layer 27. For example, a metal or other conductive layer may be formed on portions of the second spacer layer 27 using a masking and/or patterning process. The step difference defined by the portions of the second spacer layer 27 within and outside the recess 26r in the first spacer layer 26 results in the field plate 33 including first and second portions 33a and 33b in a stepped configuration. A graded portion may connect the step portions 33a and 33b. The thickness of the second spacer layer 27 in the recess 26r defines a first distance or spacing Si that separates the first portion 33a of the buried field plate 33 from the surface 24s, while the combined thicknesses of the first spacer layer 26 and the second spacer 27 on the surface thereof outside the recess 26r defines a second distance or spacing S2 that separates the second portion 33b of the buried field plate 33 from the surface 24s.

The first portion 33a of the field plate 33 may laterally extend on the second spacer layer 27 by a distance $L_{fs}$ toward one side (e.g., the source side) of the device. The second portion 33b of the field plate 33 may laterally extend on the second spacer layer 27 by a distance $L_{fd}$ toward another side (e.g., the drain side) of the device. $L_{fs}$ and $L_{fd}$ can be the same or different distances. In some embodiments, the portions 33a, 33b of the field plate 33 at the different spacings S1, S2 from the surface 24s may not be continuous. For example, the first portion 33a may be formed on the portion of the second spacer layer 27 in the recess 26r, and the second portion 33b may be separately formed on the surface of the second spacer layer 27 outside the recess or may otherwise include a discontinuity with the first portion 33a. That is, the first and second portions 33a, 33b of the field plate 33 may be defined by a single continuous layer or by multiple stacked layers.

By forming the recess 26r in FIG. 3, forming the second spacer layer 27 in the recess 26r in FIG. 4, and forming the first portion 33a of the buried field plate 33 in the recess 26r in FIG. 5, the first portion 33a of the field plate 33 is closer to the surface 24s than the second portion 33b of the field plate 33. The reduced thickness Si of the dielectric or other spacer insulator layer 25 between the portion 33a of field plate 33 and the surface 24s may reduce capacitance resulting from providing the field plate 33 between the gate and the drain electrode (e.g., relative to a planar field plate having a uniform spacing S2 from the surface 24s).

Figure 6:
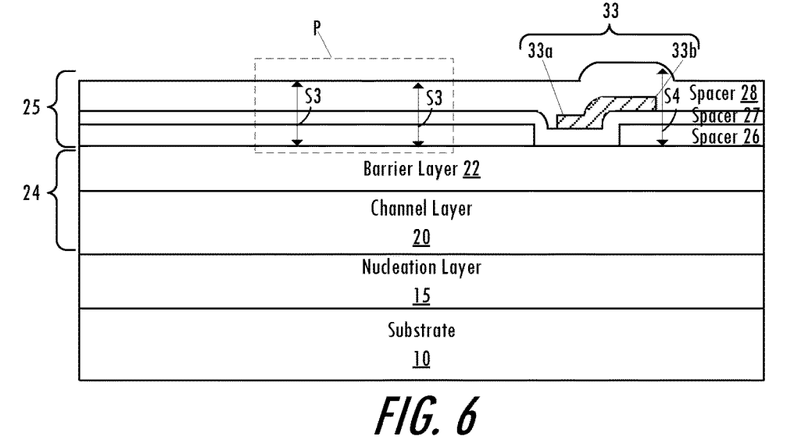

In FIG. 6, a third spacer layer 28 is formed on the second spacer layer 27 and on the field plate 33. The third spacer layer 28 may conformally extend along the surface of the second spacer layer 27 and the stepped portions 33a, 33b of the field plate 33 to define a buried field plate configuration. The third spacer layer 28 may likewise be a dielectric or other insulator layer (e.g., a silicon nitride or silicon oxide layer), and may be formed by similar or different methods than the first and/or second spacer layers 26 and/or 27. The first, second, and third spacer layers 26, 27, 28 may collectively define the spacer insulator layer 25 as described herein.

The spacer layers 26, 27, 28 of the spacer insulator layer 25 described herein may be dielectric material, such as silicon nitride, aluminum nitride, silicon dioxide, and/or other suitable material. Other materials may also be utilized for the layers 26, 27, 28 of the spacer insulator layer 25. For example, the spacer layers 26, 27, 28 may also include magnesium oxide, scandium oxide, aluminum oxide and/or aluminum oxynitride. The spacer layers 26, 27, 28 may have the same or different thicknesses. In some embodiments, the first spacer layer 26 may have a smaller thickness than the second spacer layer 27, and/or the second spacer layer 27 may have a smaller thickness than the third spacer layer 28. The spacer insulator layer 25 may include a portion P having a substantially uniform thickness or spacing S3 relative to the surface 24s of the semiconductor layer structure 24, and a portion having a non-uniform thickness or spacing S4.

As noted above, although illustrated with reference to a field plate 33 including two step portions 33a, 33b, stepped or graded field plates in accordance with embodiments of the present invention may include additional step portions. For example, still referring to FIG. 6, an additional aperture or recess (not shown) may be formed in the third spacer layer 28 to expose at least part of the second portion 33b of the field plate, and additional step portions of the field plate 33 (not shown) may be formed on the second portion 33b of the field plate 33 exposed by the additional recess and on the surface of the third spacer layer 28 outside the additional recess. More generally, while illustrated with reference to fabrication of a spacer insulator layer 25 including three spacer layers 26, 27, 28 and a field plate 33 including two step portions 33a, 33b, it will be understood that spacer insulator layers 25 with more than three spacer layers and field plates 33 with more than two step portions may be fabricated in accordance with embodiments described herein.

Figure 7:
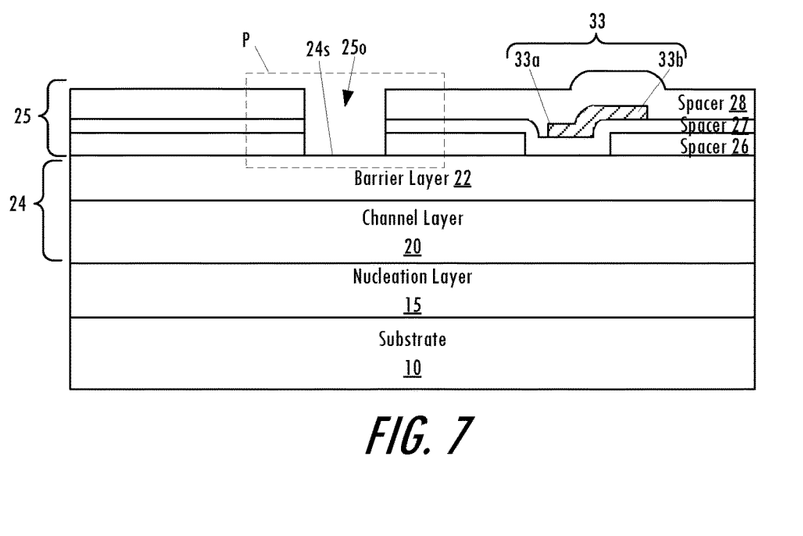

FIG. 7 illustrates formation of an aperture or opening 25o in the portion P of the spacer insulator layer 25, where the gate may be formed in a subsequent step. For example, the opening 25o may be optically defined and opened using a mask that exposes a portion of the third spacer layer 28. As shown in FIG. 7, the opening 25o extends through the spacer layers 28, 27, 26 to expose a portion of the surface 24s of the semiconductor layer structure 24 (i.e., a surface of the barrier layer 22). The opening 25o may be formed utilizing a patterned mask and a low-damage etch with respect to the barrier layer 22. The opening 25o may be offset between the source and drain such that the opening 25o, and subsequently the gate, may be closer to the source electrode than the drain electrode. Also, although illustrated as being uniform in width, it will be understood that the opening 25o may be wider in some portions, due to isotropy of the etch with respect to the multiple layers 26, 27, 28 of the spacer insulator layer 25.

Figure 8:
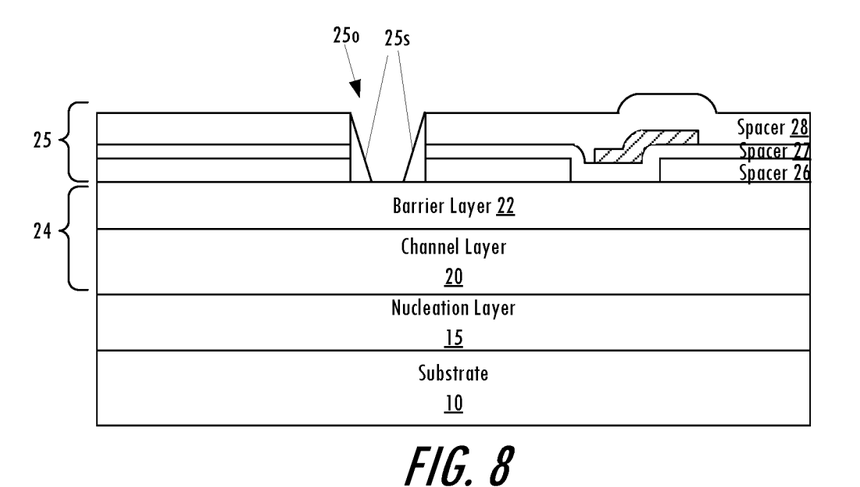

As shown in FIG. 8, sidewall spacers 25s are formed at opposing sidewalls in the opening 25o of the spacer insulator layer 25. For example, the sidewall spacers 25s may be formed to define a desired first gate length $L_{G1}$ to be formed in a subsequent step, particularly in embodiments where the gate opening 25o is non-uniform in width as noted above. In some embodiments, the sidewall spacers 25s may be formed using a spacer insulator shrink process. The sidewall spacers 25s may likewise be a dielectric or other insulator layer (e.g., a silicon nitride or silicon oxide layer), and may separate the lateral extension of the first portion 33a of the buried field plate 33 from contacting the gate 32.

Figure 9:
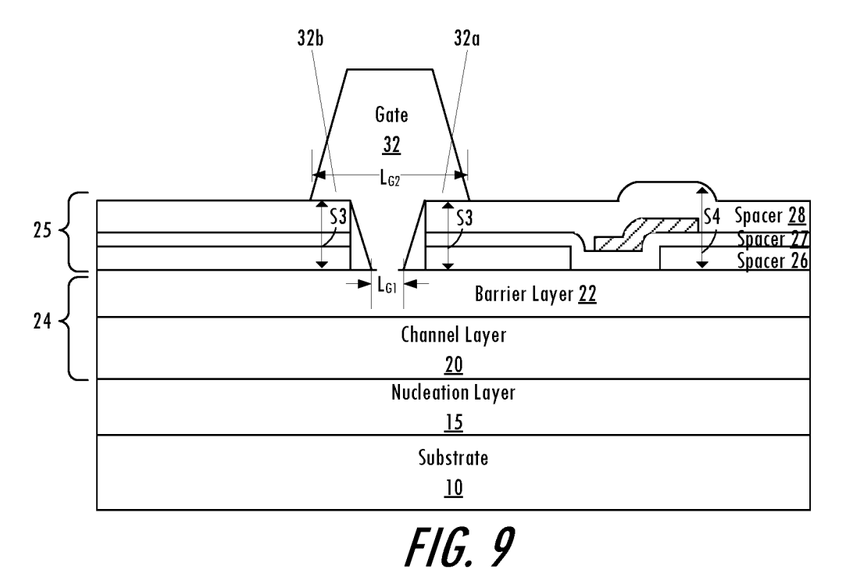

FIG. 9 illustrates formation of the gate 32 in the opening 25o in the spacer insulator layer 25. The gate 32 extends through the spacer insulator layer 25 to contact the exposed portion of the barrier layer 22. The gate 32 may be formed via a metallization process in the opening 25o directly on the sidewall spacers 25s at the opposing sidewalls of the spacer insulator layer 25, such that gaps may not be formed between the two. Suitable gate materials may depend on the composition of the barrier layer 22. However, in certain embodiments, materials capable of making a Schottky contact to a nitride based semiconductor material may be used for the gate 32, such as Ni, Pt, $NiSi_x$, Cu, Pd, Cr, TaN, W and/or WSiN.

The gate 32 includes one or more extended portions (illustrated as opposing sidelobes portions 32a, 32b) that laterally extend on surface portions of the spacer insulator layer 25 outside the opening 25o to define a second gate length $L_{G2}$. The sidelobe portions 32a, 32b may be integral to the gate 32. The length by which the sidelobe portions 32a, 32b extend onto the spacer insulator layer 25 at opposing sides of the gate 32 may be controlled in the fabrication process. In some embodiments, the sidelobe portion 32a may be longer (and thus, define a greater portion of the second gate length $L_{G2}$) than the sidelobe portion 32b, or vice versa. In other embodiments, the sidelobe portions 32a and 32b may laterally extend along the surface of the third spacer layer 28 by substantially the same length at opposing sides of the gate 32. Gate-to-drain capacitance ($C_{gd}$) and/or gate-to-source capacitance ($C_{gs}$) of the transistor device, which may be due to the sandwiching of the portions of the spacer insulator layer 25 between the sidelobe portions 32a, 32b and the semiconductor layer structure 24, may be further controlled as described below.

As shown in FIG. 9, the gate 32 is formed such that the sidelobe portions 32a and 32b are separated from the surface 24s of the semiconductor layer structure 24s (and thus, the conduction channel defined at the heterojunction between barrier layer 22 and channel layer 20) by a substantially uniform distance or spacing S3 at opposite sides of the gate 32. In embodiments described herein, the buried field plate 33 having the stepped shape may be configured to increase a planarity of the third spacer layer 28 on which the sidelobe portions 32a and 32b of the gate 32 extend, such that the spacer insulator layer 25 includes substantially coplanar surfaces at the opposing sides of the gate 32, with the first and second portions 33a and 33b of the field plate 33 confined therebelow.

In particular, due to the recess 26r in the first spacer layer 26 formed in FIG. 3, an upper surface of the first portion 33a of the buried field plate 33 may be substantially coplanar with the upper surface of the second spacer layer 27 on which the third spacer layer 28 is formed. As such, when the third spacer layer 28 is formed on the field plate 33 and the second spacer layer 27 in FIG. 6, the surface of portion P of the spacer insulator layer 25 in which the gate opening 25o is formed may be substantially planar, such that the sidelobe portions 32a and 32b formed thereon at opposite sides of the gate 32 may be formed on substantially coplanar surfaces and uniformly spaced from the surface 24s of the semiconductor layer structure 24 by a spacing S3. In contrast, portions of the third spacer layer 28 formed on the second step portion 33b of the field plate 33, which is outside the recess 26r may have a non-uniform thickness (shown by spacing S4). The stepped or graded structure of the buried field plate 33 increases a distance between the non-uniform thickness S4 of the third spacer layer 28 and the portion P in which the gate 32 is formed, such that the sidelobes or wings 32a and 32b are spaced apart from the surface 24s by the uniform spacing S3. In some embodiments, the gate 32 may be formed with sidelobes or wings 32a and 32b that extend substantially symmetrically on opposite sides of the gate 32.

Figure 10:
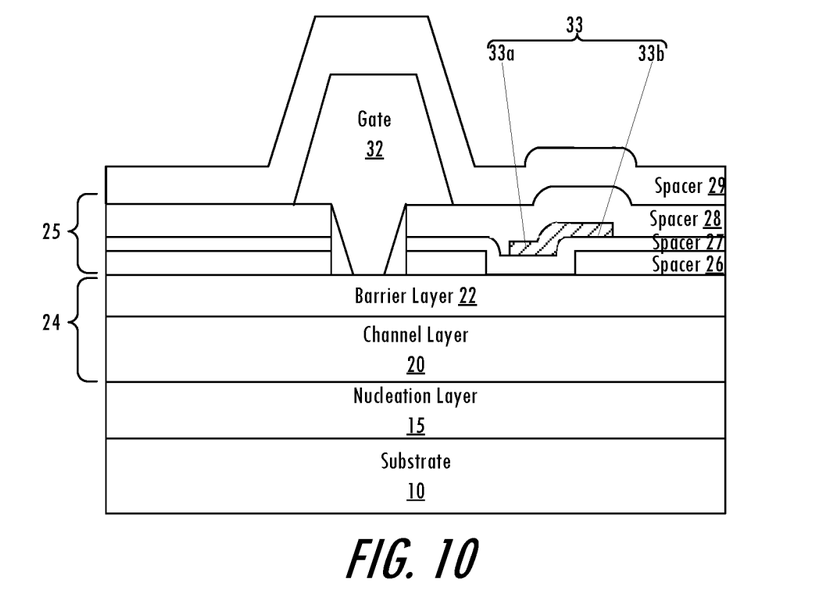

In FIG. 10, a fourth spacer layer 29 is formed on the gate 32 and the third spacer layer 28. The fourth spacer layer 29 may conformally extend along the sidelobes 32a, 32b and upper surface of the gate 32, and along the surface of the third spacer layer 28. The fourth spacer layer 29 may likewise be a dielectric or other insulator layer (e.g., a silicon nitride or silicon oxide layer), and may be formed by similar or different methods than the first, second, and/or third spacer layers 26, 27, 28. In some embodiments, the fourth spacer layer 29 may be a passivation layer that is formed at lower temperatures than the first, second, and/or third spacer layers 26, 27, 28, as such higher temperatures may not be feasible once the gate metallization has been deposited.

Figure 11:
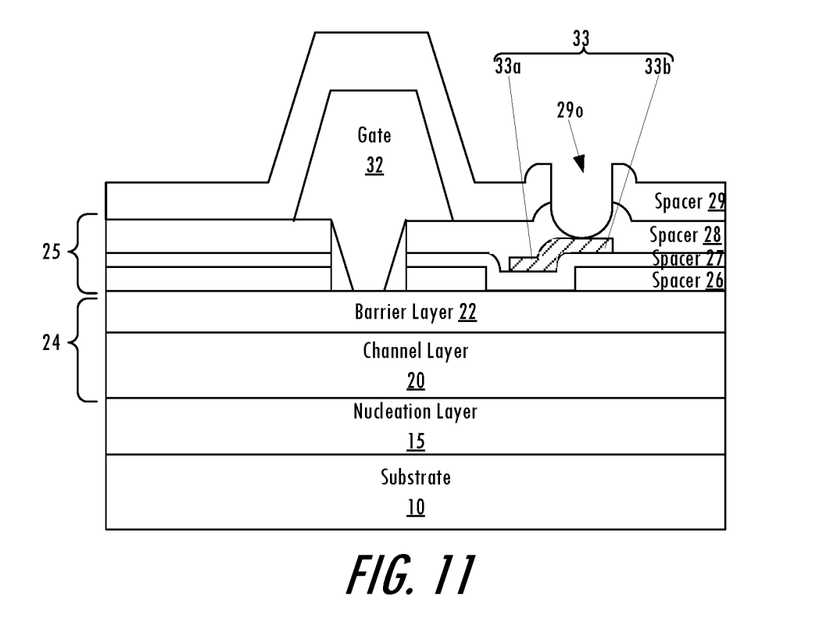

In FIG. 11, an aperture or opening 290 is formed in the fourth spacer layer 29 to expose a portion of the field plate 33. For example, the opening 290 may be optically defined and opened using a mask that exposes a portion of the fourth spacer layer 29 overlying the field plate 33. As shown in FIG. 11, the opening 290 extends through the spacer layers 29, 28 to expose a surface of the second portion 33b of the buried field plate 33. The opening 290 may additionally or alternatively expose a surface of the first portion 33a of the buried field plate 33.

Figure 12:
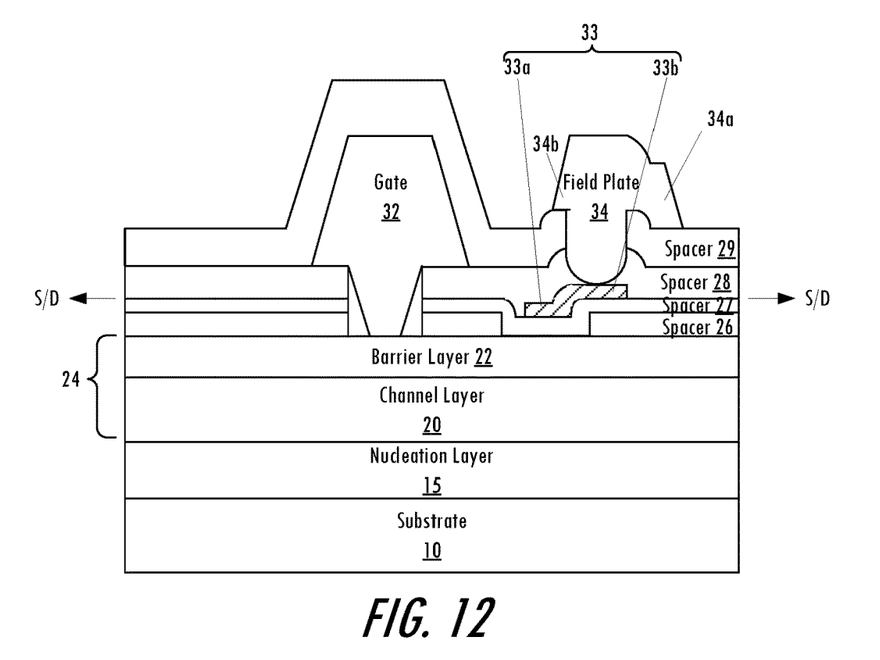

FIG. 12 illustrates formation of an additional or second field plate 34 in the opening 290 to contact the buried field plate 33. The second field plate 34 is a conductive structure that extends through the spacer layers 29, 28 to contact the first and/or second portions 33a, 33b of the buried field plate. The second field plate 34 may also have a stepped or graded structure, with a first portion 34a that is closer to the surface 24s of the semiconductor layer structure 24 than a second portion 34b. A step difference between surfaces of the first and second portions 34a and 34b of the second field plate 34 may be the same as or different than a step difference between surfaces of the first and second portions 33a and 33b of the buried field plate 33. The lateral extension of the first portion 34a of second field plate 34 toward the source or drain (S/D) may be controlled so as to further reduce the peak or otherwise redistribute the electric field without substantially reducing the breakdown voltage beyond a threshold. Although not illustrated, source and drain electrodes may be formed on the barrier layer 22 (e.g., by etching openings into the spacer insulator layer 25 to expose the underlying barrier layer 22 and depositing ohmic contacts thereon) to arrive at the device 100 of FIG. 1.

Figure 13:
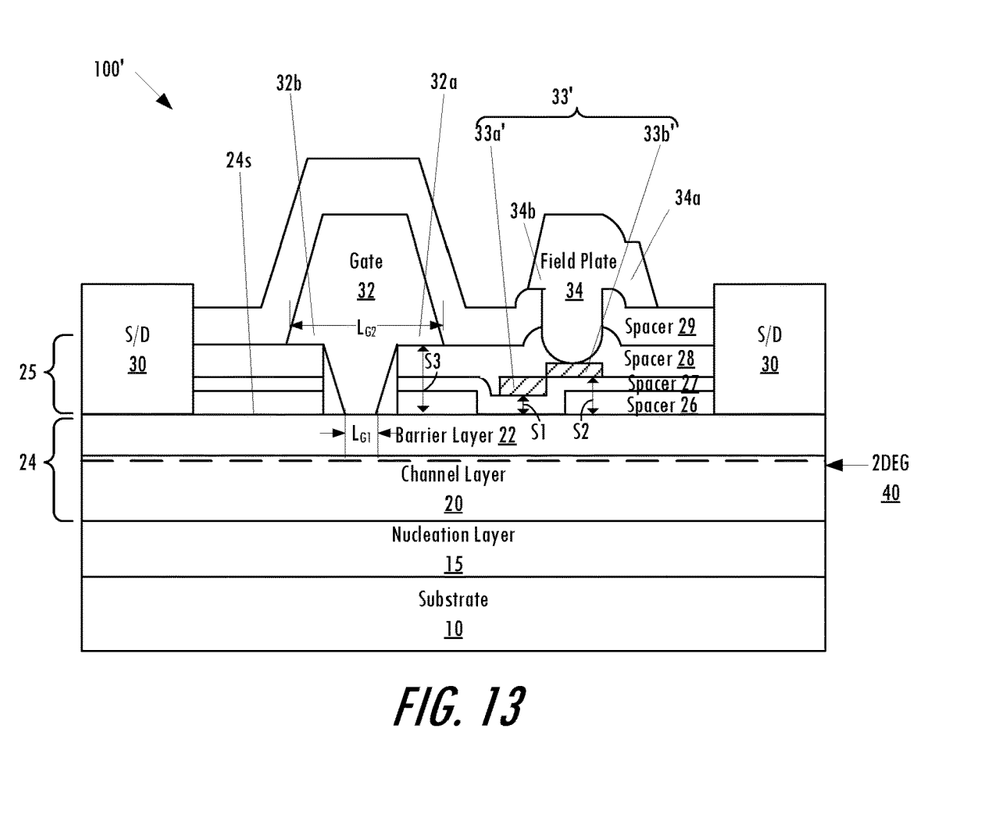
FIG. 13 is a schematic cross-section of a unit cell of a transistor device including a buried field plate according to further embodiments of the present invention.
Figure 14:
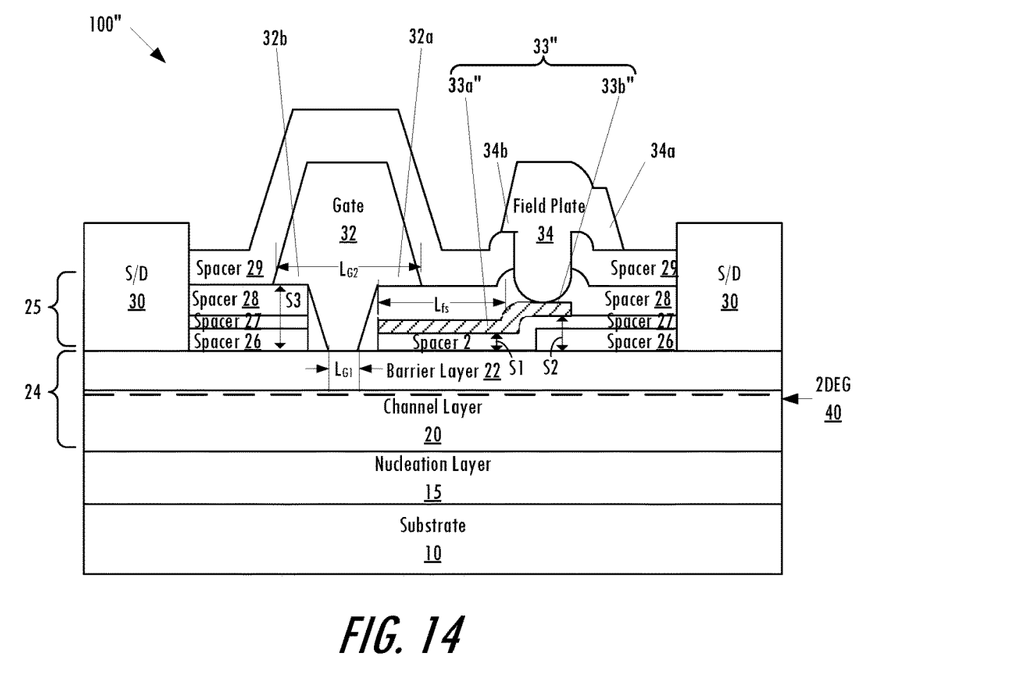
FIG. 14 is a schematic cross-section of a unit cell of a transistor device including a buried field plate according to still further embodiments of the present invention.
Figure 15:
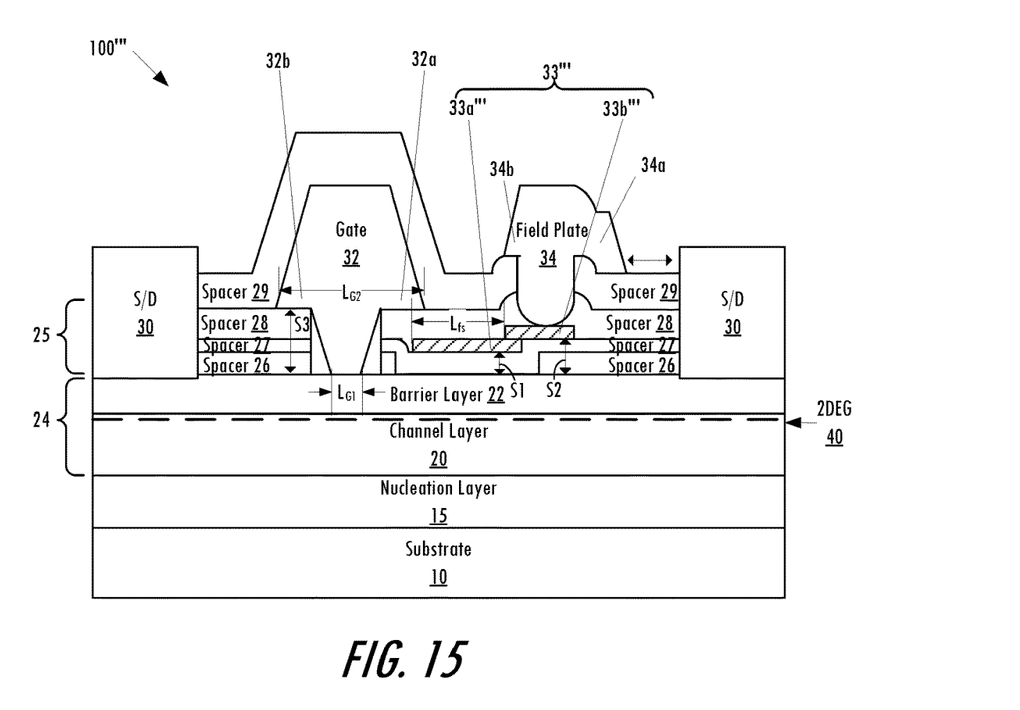
FIG. 15 is a schematic cross-section of a unit cell of a transistor device including a buried field plate according to yet further embodiments of the present invention.

FIGS. 13-15 are schematic cross-sections of unit cell of a transistor structure including buried field plates having various stepped or graded structures according to further embodiments of the present invention. In particular, FIGS. 13-15 illustrate examples of HEMTs 100', 100", and 100' including a stepped or graded buried field plate structures 33', 33", and 33', respectively. Some elements or layers of the HEMTs 100', 100", and 100' may be similar to those of the HEMT 100 of FIG. 1 and repeated description thereof is omitted.

For example, FIG. 13 illustrates a buried field plate 33' having first and second step portions 33a' and 33b' defined by respective layers, rather than a single continuous layer as shown in FIG. 1. The step portions 33a' and 33b' of the field plate 33' are positioned at different distances or spacings S1 and S2, respectively, from the surface 24s (and thus, the underlying conduction channel 40) of the semiconductor layer structure. Respective upper surfaces of the first portion of the field plate 33a' and the second spacer layer 27 may be substantially coplanar. In some embodiments, the step portions 33a' and 33b' may include a discontinuity therebetween.

In embodiments described herein, the first portion 33a of the buried field plate 33 laterally extends by the length $L_{fs}$ toward the gate 32, and the sidelobe portion 32a of the gate 32 laterally extends toward the buried field plate 33 by a portion of the gate length $L_{G2}$. In the embodiments of FIGS. 1 to 13, a lateral spacing or separation is maintained between the first portion 33a of the buried field plate 33 and the sidelobe portion 32a of the gate 32, such that the laterally extending sidelobe portion 32a of the gate 32 is free of overlap with the field plate 33. That is, the first portion 33a of the field plate 33 is confined outside an edge or boundary of the sidelobe portion 32a and does not extend between the sidelobe portion 32a and the surface 24s of the semiconductor layer structure 24, such that the first portion 33a of the buried field plate 33 and the sidelobe portion 32a of the gate 32 are non-overlapping in a direction perpendicular to the surface 24s (also referred to herein as vertical overlap). However, embodiments of the present invention are not limited to any particular length of the first portion 33a of the buried field plate 33, which may overlap with the laterally extending sidelobe portions 32a, 32b in some embodiments.

FIG. 14 is a schematic cross-section of a unit cell of a transistor structure including a buried field plate 33" where the first portion 33a" of the buried field plate 33" laterally extends toward the gate 32 beyond an edge of the sidelobe portion 32a. The first portion 33a" of the buried field plate 33" vertically overlaps the sidelobe portion 32a of the gate 32, and may further extend a distance from between an edge of the sidelobe portion 32a up to the sidewall spacer 25s. As in other embodiments described herein, electrical isolation between the first portion 33a" of the field plate 33" that overlaps with the sidelobe portion 32a of the gate 32 is provided by portions of the spacer insulator layer 25 therebetween, in particular, by the third spacer layer 28. Also, one of the sidewall spacers 25s provides electrical isolation between the lateral extension of the first portion 33a" of the buried field plate 33" and the gate 32.

In the example of FIG. 14, the first portion 33a" laterally extends along an entirety of the portion of the surface 24s between the gate 32 and the field plate 33" and contacts the sidewall spacer 25s. However, the amount of overlap of the first portion 33a" of the buried field plate 33" and the sidelobe portion 32a of the gate 32 and the length $L_{fs}$ by which the first portion 33a" extends on the gate-drain region can be varied.

FIG. 15 is a schematic cross-section of a unit cell of a transistor structure including a buried field plate 33'" where the first portion 33a'" of the buried field plate 33'" also laterally extends toward the gate 32 and beyond an edge of the sidelobe portion 32a, but along less than an entirety of the portion of the surface 24s between the gate 32 and the field plate 33". That is, the first portion 33a'" of the buried field plate 33'" vertically overlaps the sidelobe portion 32a of the gate 32, but does not contact the sidewall spacer 25s. As such, the first portion 33a'" of the field plate 33 may be laterally separated from a sidewall of the gate 32 by a thickness of the sidewall spacer 25s or more. In FIG. 15, the first and second step portions 33a'" and 33b'" are defined by respective layers, rather than a single continuous layer. The first and second step portions 33a'" and 33b'" may vertically overlap. Respective upper surfaces of the first portion 33a'" of the field plate 33'" and the second spacer layer 27 may be substantially coplanar. The first portion 33a'" of the field plate 33'" extends between one of the substantially coplanar surfaces of the third spacer layer 28 and the surface 24s. Electrical isolation between the first portion 33a'" of the field plate 33'" overlapping with the sidelobe portion 32a of the gate 32 is provided by portions of the third spacer layer 28 therebetween.

According to embodiments of the present invention, by forming the spacer insulator layer 25 with varying thicknesses Si, S2, and S3 that separate field plate step portions 33a, 33b, and gate sidelobe portion 32a from the surface 24s of the semiconductor layer structure 24, a capacitance between the gate 32 and the source or drain electrodes 30 may be reduced (e.g., relative to a planar field plate separated from the surface 24s by a spacer insulator layer having a uniform thickness). Capacitance can further be reduced and/or adjusted by avoiding and/or controlling vertical overlap between the field plate portion 33a and the gate sidelobe portion 32a in accordance with embodiments described herein.

In some embodiments, the stepped construction of the buried field plate may contribute to the reduction in peak electric field proximate to the drain. In particular, by forming the buried field plate 33 with the stepped structure 33a, 33b by forming the spacer insulating layer 25 with a greater thickness S2 between the second portion 33b of the buried field plate 33 and the surface 24s of the semiconductor layer structure 24 (and thus, closer to the conduction channel 40 defined at the heterojunction between barrier layer 22 and channel layer 20), a peak electric field adjacent the drain may be reduced, which may also reduce charge trapping effects.

Embodiments of the present invention are thus generally directed to transistor structures where a buried field plate is separated from the barrier layer by a differing distances or spacings. In some embodiments, the field plate can be separated from the semiconductor layer structures by one or more thinner spacer layers, while one or more thicker spacer layers can separate the field plate and laterally extended portions of the gate. In another embodiments, a spacer insulator layer can have variable thickness, with a relatively thin thickness between the field plate and the semiconductor layer structure and a thicker thickness between the field plate and the laterally extended portions of the gate. In some embodiments, the field plate can be provided in a recess within a spacer layer in order to reduce the distance or spacing between the field plate and the semiconductor layer structure.

While embodiments of the present invention have been described herein with reference to particular HEMT structures, the present invention should not be construed as limited to such structures, and may be applied to formation of gate electrodes in many different transistor structures, such as pHEMTs (including GaAs/AlGaAs pHEMTs) and/or GaN MESFETs.

Also, additional layers may be included in transistor devices while still benefiting from the teachings of the present invention. Such additional layers may include GaN cap layers, as described for example U.S. Pat. No. 6,548,333 to Smith. In some embodiments, insulating layers such as $SiN_x$, or relatively high quality AlN may be deposited for making a MISHEMT and/or passivating the surface. The additional layers may also include a compositionally graded transition layer or layers. In addition, the barrier layer 22 and/or channel layer 20 described above may include multiple layers. Thus, embodiments of the present invention should not be construed as limiting these layers to a single layer but may include, for example, barrier layers having combinations of GaN, AlGaN and/or AlN layers.

The present invention is described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

In the drawings and specification, there have been disclosed typical embodiments of the invention, and, although specific terms have been employed, they have been used in a generic and descriptive sense only and not for purposes of limitation.

That which is claimed:

1. A transistor, comprising:
   a semiconductor layer structure;
   a source electrode and a drain electrode on the semiconductor layer structure;
   a gate on a surface of the semiconductor layer structure between the source electrode and the drain electrode; and
   a field plate comprising a first portion adjacent the gate and a second portion adjacent the source or drain electrode, wherein the second portion is farther from the surface of the semiconductor layer structure than the first portion and is closer to the surface of the semiconductor layer structure than an extended portion of the gate.

2. The transistor of claim 1, further comprising:
   a spacer insulator layer comprising a plurality of spacer layers that are stacked on the surface of the semiconductor layer to define first, second, and third thicknesses that separate the first portion of the field plate, the second portion of the field plate, and the extended portion of the gate from the surface of the semiconductor layer structure, respectively.

3. The transistor of claim 2, wherein the plurality of spacer layers define substantially coplanar surfaces at opposing sides of the gate, wherein the extended portion of the gate laterally extends along one of the substantially coplanar surfaces toward the first portion of the field plate.

4. The transistor of claim 3, wherein the plurality of spacer layers comprises:
   a first spacer layer comprising a recess in a surface thereof;
   a second spacer layer comprising a first portion in the recess and a second portion on the surface of the first spacer layer outside the recess, wherein the first and second portions of the second spacer layer are between the first and second portions of the field plate and the surface of the semiconductor layer structure, respectively; and
   a third spacer layer comprising the substantially coplanar surfaces on the second spacer layer with the field plate therebetween.

5. The transistor of claim 3, wherein the extended portion of the gate comprises sidelobe portions that laterally extend directly along the substantially coplanar surfaces at the opposing sides of the gate, wherein the sidelobe portions are separated from the surface of the semiconductor layer structure by a substantially uniform distance along respective lengths of the sidelobe portions.

6. The transistor of claim 3, further comprising:
sidewall spacers separating the gate from one or more of the plurality of spacer layers at the opposing sides thereof, wherein the first portion of the field plate laterally extends toward the gate and is separated therefrom by one of the sidewall spacers.

7. The transistor of claim 2, wherein the field plate is a first field plate, and further comprising:
a second field plate on a surface of the spacer insulator layer and extending through a portion thereof to contact the first field plate.

8. The transistor of claim 2, wherein the plurality of spacer layers comprises:
a first spacer layer comprising a recess in a surface thereof;
a second spacer layer comprising a first portion in the recess and a second portion on the surface of the first spacer layer outside the recess, wherein the first and second portions of the second spacer layer are between the first and second portions of the field plate and the surface of the semiconductor layer structure, respectively; and
a third spacer layer on the second spacer layer with the field plate therebetween.

9. The transistor of claim 2, further comprising:
sidewall spacers separating the gate from one or more of the plurality of spacer layers at the opposing sides thereof, wherein the first portion of the field plate laterally extends toward the gate and is separated therefrom by one of the sidewall spacers.

10. The transistor of claim 1, wherein the first portion of the field plate and the extended portion of the gate laterally extend towards one another and are non-overlapping in a direction perpendicular to the surface of the semiconductor layer structure.

11. A transistor, comprising:
a semiconductor layer structure;
a source electrode and a drain electrode on the semiconductor layer structure;
a gate on a surface of the semiconductor layer structure between the source electrode and the drain electrode; and
a field plate comprising a first portion adjacent the gate and a second portion adjacent the source or drain electrode, wherein the second portion is farther from the surface of the semiconductor layer structure than the first portion,
wherein the field plate is closer to the surface of the semiconductor layer structure than a laterally extended portion of the gate, and wherein the laterally extended portion of the gate is free of overlap with the field plate.

12. The transistor of claim 11, further comprising:
a spacer insulator layer comprising a plurality of spacer layers that are stacked on the surface of the semiconductor layer to define first, second, and third thicknesses that separate the first portion of the field plate, the second portion of the field plate, and the laterally extended portion of the gate from the surface of the semiconductor layer structure, respectively.

13. The transistor of claim 12, wherein the plurality of spacer layers define substantially coplanar surfaces at opposing sides of the gate, and wherein the laterally extended portion of the gate comprises sidelobe portions that laterally extend directly along the substantially coplanar surfaces at the opposing sides of the gate.

14. The transistor of claim 13, wherein the plurality of spacer layers comprises:
a first spacer layer comprising a recess in a surface thereof;
a second spacer layer comprising a first portion in the recess and a second portion on the surface of the first spacer layer outside the recess, wherein the first and second portions of the second spacer layer are between the first and second portions of the field plate and the surface of the semiconductor layer structure, respectively; and
a third spacer layer comprising the substantially coplanar surfaces on the second spacer layer with the field plate therebetween.

15. The transistor of claim 12, wherein the field plate is a first field plate, and further comprising:
a second field plate on a surface of the spacer insulator layer and extending through a portion thereof to contact the first field plate.

16. The transistor of claim 12, wherein the plurality of spacer layers comprises:
a first spacer layer comprising a recess in a surface thereof;
a second spacer layer comprising a first portion in the recess and a second portion on the surface of the first spacer layer outside the recess, wherein the first and second portions of the second spacer layer are between the first and second portions of the field plate and the surface of the semiconductor layer structure, respectively; and
a third spacer layer on the second spacer layer with the field plate therebetween.

17. A transistor, comprising:
a channel layer and a barrier layer defining a heterojunction therebetween;
a source electrode and a drain electrode on the barrier layer;
a gate on the barrier layer and comprising sidelobe portions laterally extending from opposing sides of the gate toward the source electrode and the drain electrode, respectively;
a field plate on the barrier layer between the gate and the drain electrode; and
a spacer insulator layer comprising a plurality of spacer layers with the field plate therebetween, wherein the spacer layers are stacked on the barrier layer at the opposing sides of the gate and separate the sidelobe portions of the gate from the barrier layer by a substantially uniform distance along respective lengths of the sidelobe portions.

18. The transistor of claim 17, wherein the plurality of spacer layers define substantially coplanar surfaces at the opposing sides of the gate with the sidelobe portions of the gate laterally extending directly thereon.

19. The transistor of claim 18, wherein the spacer layers have a substantially uniform thickness at the opposing sides of the gate.

20. The transistor of claim 18, wherein the field plate comprises a first portion adjacent the gate and a second portion adjacent the drain electrode, wherein the second portion is farther from a surface of the barrier layer than the first portion.

21. The transistor of claim 20, wherein the first portion of the field plate and one of the sidelobe portions of the gate laterally extend towards one another and are non-overlapping in a direction perpendicular to the surface of the barrier layer.

22. The transistor of claim 17, wherein the field plate is a first field plate, and further comprising:
a second field plate on a surface of the spacer insulator layer and extending through a portion thereof to contact the first field plate.

23. A transistor, comprising:
a channel layer and a barrier layer defining a heterojunction therebetween;
a source electrode and a drain electrode on the barrier layer;
a gate on the barrier layer and comprising sidelobe portions laterally extending from opposing sides of the gate toward the source electrode and the drain electrode, respectively;
a field plate on the barrier layer between the gate and the drain electrode, wherein the field plate comprises a first portion adjacent the gate and a second portion adjacent the drain electrode, wherein the second portion is farther from a surface of the barrier layer than the first portion;
a spacer insulator layer comprising a plurality of spacer layers with the field plate therebetween, wherein the spacer layers are stacked on the barrier layer at the opposing sides of the gate and separate the sidelobe portions of the gate from the barrier layer; and
sidewall spacers separating the gate from the plurality of spacer layers at the opposing sides thereof, wherein the first portion of the field plate laterally extends toward the gate and is separated therefrom by one of the sidewall spacers.

24. A method of fabricating a transistor, the method comprising:
forming a channel layer and a barrier layer defining a heterojunction therebetween;
forming a source electrode, a drain electrode, and a gate on the barrier layer, wherein the gate comprises sidelobe portions laterally extending from opposing sides of the gate toward the source electrode and the drain electrode, respectively; and
forming a spacer insulator layer and a field plate on the barrier layer, the spacer insulator layer comprising a plurality of spacer layers with the field plate therebetween, wherein the spacer layers are stacked on the barrier layer at the opposing sides of the gate and separate the sidelobe portions of the gate from the barrier layer by a substantially uniform distance along respective lengths of the sidelobe portions.

25. The method of claim 24, wherein the plurality of spacer layers define substantially coplanar surfaces with the sidelobe portions of the gate laterally extending directly thereon.

26. The method of claim 24, wherein the field plate comprises a first portion adjacent the gate and a second portion adjacent the source or drain electrode, wherein the second portion is farther from a surface of the barrier layer than the first portion.

27. The method of claim 24, wherein the field plate is a first field plate, and further comprising:
forming an opening extending through the spacer insulator layer to expose the first field plate; and
forming a second field plate on a surface of the spacer insulator layer and extending into the opening to contact the first field plate.

28. A method of fabricating a transistor, the method comprising:
forming a channel layer and a barrier layer defining a heterojunction therebetween;
forming a source electrode, a drain electrode, and a gate on the barrier layer, wherein the gate comprises sidelobe portions laterally extending from opposing sides of the gate toward the source electrode and the drain electrode, respectively; and
forming a spacer insulator layer and a field plate on the barrier layer, the spacer insulator layer comprising a plurality of spacer layers with the field plate therebetween, wherein the spacer layers are stacked on the barrier layer at the opposing sides of the gate and separate the sidelobe portions of the gate from the barrier layer, wherein the field plate comprises a first portion adjacent the gate and a second portion adjacent the source or drain electrode, wherein the second portion is farther from a surface of the barrier layer than the first portion, and wherein forming the spacer insulator layer and the field plate comprises:
forming a first spacer layer comprising a recess in a surface thereof;
forming a second spacer layer comprising a first portion in the recess and a second portion on the surface of the first spacer layer outside the recess;
forming the first and second portions of the field plate on the first and second portions of the second spacer layer, respectively; and
forming a third spacer layer on the second spacer layer and the first and second portions of the field plate.

29. The method of claim 28, wherein the field plate is a first field plate, and further comprising:
forming an opening extending through the third spacer layer to expose at least one of the first or second portions of the first field plate; and
forming a second field plate on the third spacer layer and extending into the opening to contact the first field plate.

* * * * *

UNITED STATES PATENT AND TRADEMARK OFFICE
CERTIFICATE OF CORRECTION

PATENT NO. : 11,075,271 B2
APPLICATION NO. : 16/600825
DATED : July 27, 2021
INVENTOR(S) : Jones et al.

It is certified that error appears in the above-identified patent and that said Letters Patent is hereby corrected as shown below:

In the Specification

Column 11, Line 5: Please correct "Si" to read -- S1 --

Column 11, Line 34: Please correct "Si" to read -- S1 --

Column 14, Line 1: Please correct "290" to read -- 29$o$ --

Column 14, Line 3: Please correct "290" to read -- 29$o$ --

Column 14, Line 6: Please correct "290" to read -- 29$o$ --

Column 14, Line 8: Please correct "290" to read -- 29$o$ --

Column 14, Line 12: Please correct "290" to read -- 29$o$ --

Column 14, Line 37: Please correct "100', 100", and 100'" to read -- 100', 100", and 100''' --

Column 14, Line 39: Please correct "33', 33", and 33'" to read -- 33', 33", and 33''' --

Column 14, Line 40: Please correct "100', 100", and 100'" to read -- 100', 100", and 100''' --

Column 15, Line 60: Please correct "Si" to read -- S1 --

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*